(12) United States Patent
Na

(10) Patent No.: US 10,643,687 B2
(45) Date of Patent: May 5, 2020

(54) SENSING CIRCUIT AND SEMICONDUCTOR DEVICE INCLUDING THE SAME

(71) Applicant: SK hynix Inc., Icheon-si, Gyeonggi-do (KR)

(72) Inventor: One Gyun Na, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/206,601

(22) Filed: Nov. 30, 2018

(65) Prior Publication Data
US 2019/0362767 A1 Nov. 28, 2019

(30) Foreign Application Priority Data

May 23, 2018 (KR) .......................... 10-2018-0058434

(51) Int. Cl.
| | | |
|---|---|---|
| G11C 11/34 | (2006.01) | |
| G11C 11/4091 | (2006.01) | |
| G11C 11/4099 | (2006.01) | |
| G11C 11/408 | (2006.01) | |
| G11C 11/4094 | (2006.01) | |

(52) U.S. Cl.
CPC ...... *G11C 11/4091* (2013.01); *G11C 11/4085* (2013.01); *G11C 11/4094* (2013.01); *G11C 11/4099* (2013.01)

(58) Field of Classification Search
CPC ............ G11C 11/4091; G11C 11/4085; G11C 11/4094; G11C 11/4099
See application file for complete search history.

(56) References Cited

U.S. PATENT DOCUMENTS

| | | | | | |
|---|---|---|---|---|---|
| 6,028,797 | A | * | 2/2000 | Kim ......................... | G11C 7/06 365/190 |
| 6,301,175 | B1 | * | 10/2001 | Seyyedy ................ | G11C 7/065 365/149 |
| 6,590,819 | B1 | * | 7/2003 | Baum ..................... | G11C 7/06 365/202 |
| 9,202,531 | B2 | | 12/2015 | Seo | |
| 10,074,408 | B2 | * | 9/2018 | Seo ......................... | G11C 7/08 |
| 2015/0036444 | A1 | | 2/2015 | Seo | |

FOREIGN PATENT DOCUMENTS

| | | | |
|---|---|---|---|
| KR | 1020100036596 A | | 4/2010 |
| KR | 1020150015809 A | | 2/2015 |

* cited by examiner

*Primary Examiner* — Pho M Luu
(74) *Attorney, Agent, or Firm* — William Park & Associates Ltd.

(57) ABSTRACT

A semiconductor device includes a sensing circuit. The sensing circuit includes a sense amplifier configured to sense and amplify data applied to each of a sensing line and a reference line. The sensing circuit further includes a first isolation circuit configured to selectively control a connection between a matching line and the sensing line in response to an isolation signal. The sensing circuit also includes a second isolation circuit configured to selectively control a connection between the reference line and a bit line in response to the isolation signal. The sensing circuit additionally includes an inverter coupled between the sensing line and the bit line.

20 Claims, 8 Drawing Sheets

SENSING CIRCUIT AND SEMICONDUCTOR DEVICE INCLUDING THE SAME

CROSS-REFERENCE TO RELATED APPLICATION

This application claims priority based upon Korean patent application No. 10-2018-0058434, filed on May 23, 2018, the disclosure of which is hereby incorporated herein by reference in its entirety.

BACKGROUND

1. Technical Field

Embodiments of the present disclosure may generally relate to a semiconductor device including a sensing circuit, and more particularly, to a technology for reducing the size of a region of the semiconductor device.

2. Related Art

A semiconductor memory device may be or include a memory device capable of storing data and reading the stored data. A semiconductor memory device such as a DRAM from among volatile memory devices includes a bit line sense amplifier. After a memory cell accesses the bit line sense amplifier, charge sharing between the memory cell and the bit line is achieved in the bit line sense amplifier, such that a signal difference generated in the bit line is amplified by the bit line sense amplifier.

Generally, a bit line structure of the semiconductor memory device may be classified as an open bit line structure or a folded bit line structure.

The semiconductor memory device having the open bit line structure includes a bit line extending from the bit line sense amplifier and a complementary bit line extending opposite to the bit line sense amplifier. The semiconductor memory device having the open bit line structure includes many more memory cells than the semiconductor memory device having the folded bit line structure.

However, the open bit line structured semiconductor memory device includes a dummy mat in the outermost edge region. Whereas half of bit lines of the dummy mat located at the outermost edge region are coupled to a bit line sense amplifier, the other half of the bit lines may remain in the dummy. Due to the dummy mat, a total chip size of the semiconductor memory device unavoidably increases.

SUMMARY

In accordance with the present teachings is a sensing circuit that includes a sense amplifier configured to sense and amplify data applied to each of a sensing line and a reference line. The sensing circuit further includes a first isolation circuit configured to selectively control a connection between a matching line and the sensing line in response to an isolation signal. The sensing circuit also includes a second isolation circuit configured to selectively control a connection between the reference line and a bit line in response to the isolation signal. The sensing circuit additionally includes an inverter coupled between the sensing line and the bit line.

Also in accordance with the present teachings is a semiconductor device that includes a mat configured to store data selected by a word line and a bit line in a cell array. The semiconductor device further includes a sensing circuit including a plurality of sense amplifiers. The sensing circuit is configured to sense and amplify data applied to each of a sensing line and a reference line. During a sensing operation of the plurality of sense amplifiers, the sensing circuit may cut off a connection between a matching line and the sensing line in response to an isolation signal, and may cut off a connection between the reference line and the bit line.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing exemplary embodiments consistent with this disclosure. The exemplary embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof. Wherever possible, the same reference numbers are used throughout the drawings to refer to the same or like portions.

Various embodiments of the present disclosure are directed to providing a sensing circuit and a semiconductor device including the same that substantially obviate one or more problems due to limitations and disadvantages of the related art. Some embodiments relate to a semiconductor device for reducing a chip size by removing a dummy mat located at an edge region.

Figure 1:
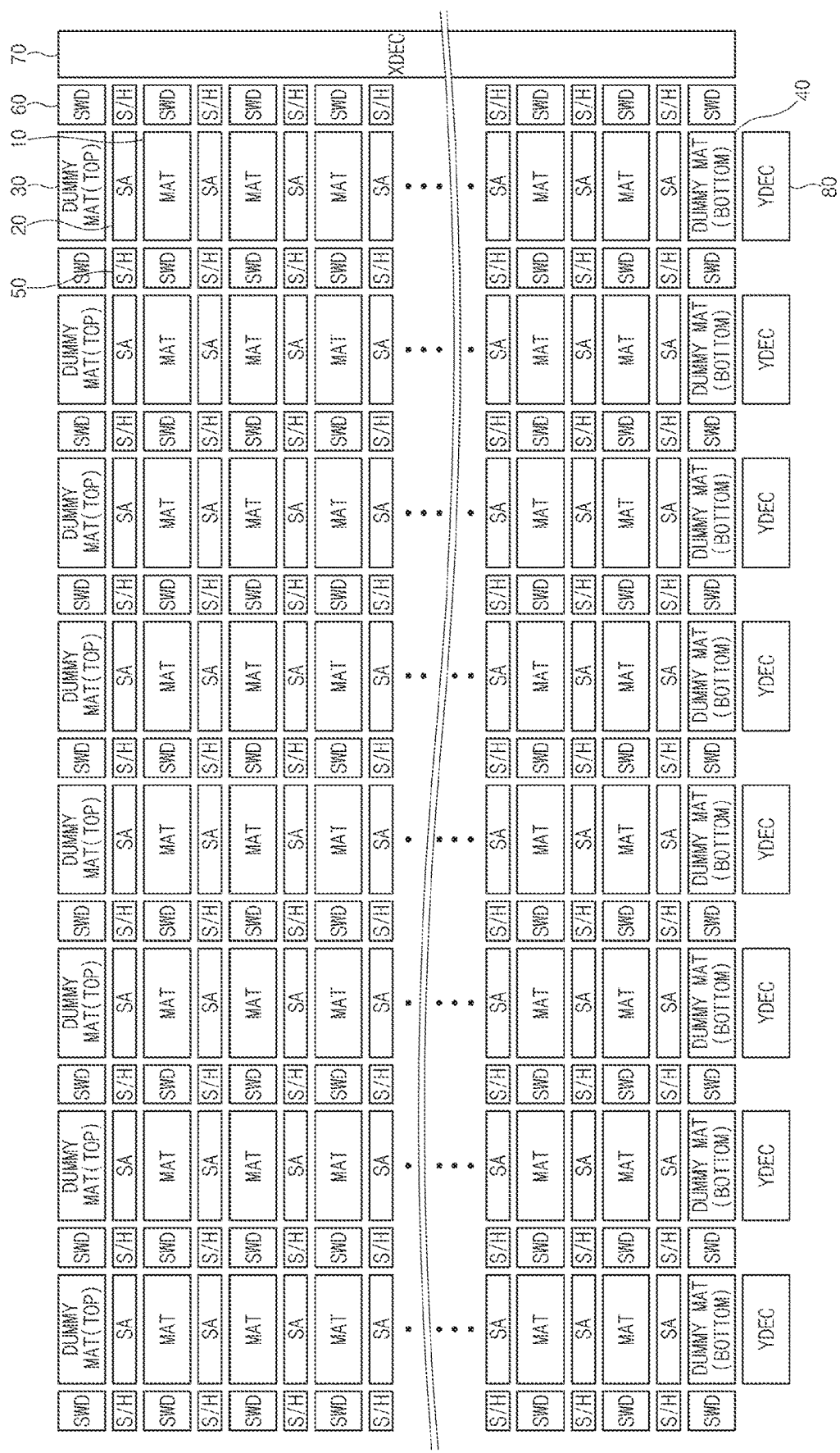
FIG. 1 shows a circuit diagram illustrating a semiconductor device including dummy mats, according to an embodiment of the present disclosure.

FIG. 1 shows a circuit diagram illustrating a semiconductor device including dummy mats, according to an embodiment of the present disclosure.

Referring to FIG. 1, a semiconductor device may include a plurality of mats (MAT) 10, a plurality of sense amplifiers (SA) 20, a plurality of dummy mats 30 and 40, a plurality of sub holes (S/H) 50, a plurality of sub word-line drivers (SWD) 60, a row decoder (XDEC) 70, and a plurality of column decoders (YDEC) 80.

In each mat (MAT) 10, a word line is selected according to the row decoder (XDEC) 70 and a bit line is selected according to the column decoder 80 (YDEC), such that data may be stored in a cell array. A plurality of mats (MAT) 10 may be arranged in the row and column directions.

The sense amplifiers (SA) 20 may be located close to the respective mats (MAT) 10. Each of the sense amplifiers (SA) 20 may sense and amplify data received from a contiguous mat 10. After a cell array of the mat (MAT) 10 is accessed, charge sharing between the cell array and a pair of bit lines BL and /BL is achieved, such that data may be sensed by the sense amplifiers (SA) 20.

The plurality of sense amplifiers (SA) 20 may be arranged in the row and column directions. Among the plurality of sense amplifiers (SA) 20, the sense amplifiers (SA) 20 located between the dummy mat 30 and the mat (MAT) 10 may be commonly coupled to a reference bit line of the dummy mat 30 and a normal bit line of the mat (MAT) 10.

The dummy mats 30 and 40 may be located close to the mats (MAT) 10, and may be arranged in an outermost edge region. Specifically, the dummy mat 30 may be arranged in the outermost upper edge region, and the dummy mat 40 may be arranged in the outermost lower edge region. Each of the dummy mats 30 and 40 of the open bit line structured semiconductor device may include a reference bit line having the same loading as the bit line accessed for stable operation.

The plurality of sub holes (S/H) 50 may be arranged at intersection regions of the sense amplifiers (SA) 20 and the sub word line drivers (SWD) 60. The plurality of sub holes (S/H) may be arranged in the row and column directions. In this case, the sub holes (S/H) may indicate regions in which a sense amplifier (sense-amp) driver for generating a sense amplifier (sense-amp) driving signal, a bit line equalizing driver for generating a bit line equalizing signal, a bit line isolation driver for generating a bit line isolation signal, and the like, are arranged.

The sub word line drivers (SWD) 60 may be located close to the respective mats (MAT) 10. Each sub word line driver (SWD) 60 may drive a word line of each mat 10 in response to a row address of the row decoder (XDEC) 70.

The column decoders (YDEC) 80 may be located below the dummy mats 40. The column decoders (YDEC) 80 may generate column addresses for selecting bit lines of the respective mats (MAT) 10.

Operations of the above-mentioned semiconductor device are hereinafter described.

First, a row address strobe (RAS) signal (/RAS) acting as a main signal for operating the semiconductor memory device (e.g., DRAM) is activated to a low level, so that at least one row address signal is input to a row address buffer. In this case, the input row address signals are decoded by the row decoder (XDEC) 70 such that a row decoding operation for selecting one of word lines contained in a cell array may be carried out by decoding the row address signals.

In this case, data of cells coupled to the selected word line is applied to the pair of bit lines BL and /BL composed of a bit line and its complementary bit line. As a result, a sense-amplifier (also called a sense-amp) enable signal indicating an operation start time of the sense amplifier 20 is enabled to drive a sense-amp driving circuit of a cell block selected by the row address signals.

Thereafter, sense-amp bias potentials are transitioned to a core voltage (Vcore) and a ground voltage (Vss) by the sense-amp driving circuit, so that the sense amplifier 20 is driven. If the sense amplifier 20 starts operation, voltages of the bit lines BL and /BL that have maintained a slight potential difference therebetween are transitioned to have a high potential difference therebetween.

Thereafter, the column decoders (YDEC) 80 may turn on a column transfer transistor that transfers data from each bit line to data bus lines in response to column address signals, such that data stored in the pair of bit lines 13L and /BL may be output from the semiconductor device through data bus lines.

However, the open bit line structured semiconductor memory device may include a plurality of substantially inaccessible reference cells and at least one substantially inaccessible reference bit line in each of the dummy mats 30 and 40. In other words, whereas half of bit lines coupled to the dummy mats 30 and 40 are coupled to the sense amplifiers (SA) 20, the other half of bit lines may be substantially unavailable. If dummy mats 30 and 40, each of which includes a large number of cells to match loading of the pair of bit lines, are included in the semiconductor device, the chip size may unavoidably increase. The word line of each mat (MAT) 10 and word lines of the dummy mats 30 and 40 need to be simultaneously enabled during operation of the dummy mats 30 and 40, such that power consumption may unavoidably increase when two word lines are enabled.

Figure 2:
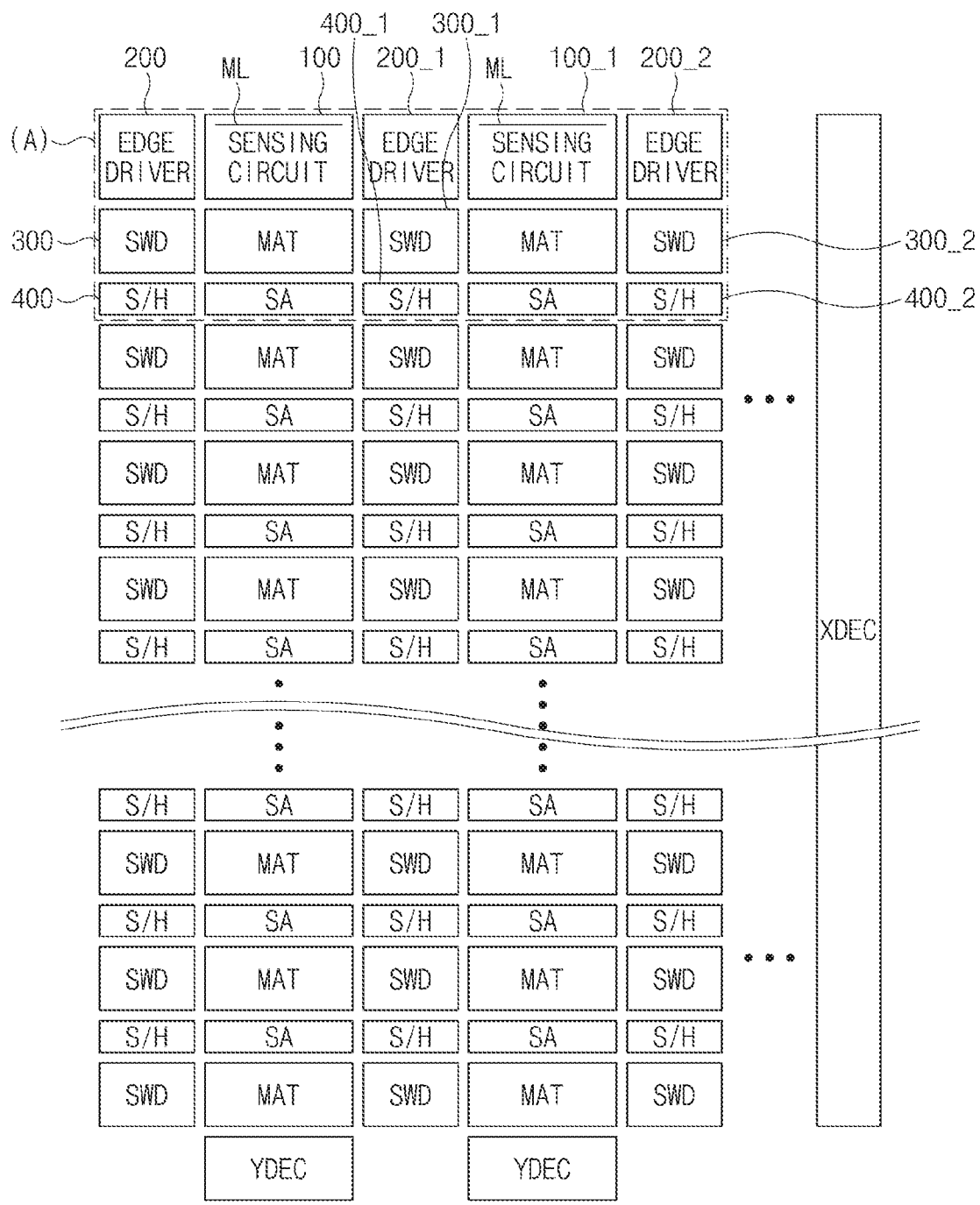
FIG. 2 shows a detailed diagram illustrating a semiconductor device, according to an embodiment of the present disclosure.

FIG. 2 shows a detailed diagram illustrating a semiconductor device, according to an embodiment of the present disclosure.

Referring to FIG. 2, the semiconductor device may include: a plurality of mats (MAT); a plurality of sense amplifiers (SA); a plurality of sub holes (S/H) 400, 400_1, and 400_2; a plurality of sub word-line drivers (SWD) 300, 300_1, and 300_2; a row decoder (XDEC); a plurality of column decoders (YDEC); a plurality of sensing circuits 100 and 100_1; a plurality of edge drivers 200, 200_1, and 200_2; and at least one matching line (ML).

In this case, the plurality of sensing circuits 100 and 100_1, the plurality of edge drivers 200, 200_1, and 200_2, and the matching line ML may be located at the uppermost part of the mats (MAT). In other words, the plurality of sensing circuits 100 and 100_1, the plurality of edge drivers 200, 200_1, and 200_2, and the matching line ML may be arranged in the outermost edge region of the semiconductor device.

Compared to the semiconductor device shown in FIG. 1, the semiconductor device shown in FIG. 2 need not include the plurality of dummy mats 30 (or dummy mats 40) shown in FIG. That is, the dummy mats 30 may be arranged in the outermost edge region of the semiconductor device shown in FIG. 1. At least one sub word-line driver (SWD) 60 for driving the dummy mats 30 may be arranged in the outermost edge region of the semiconductor device shown in FIG. 1. However, the semiconductor device shown in FIG. 2 does not include the dummy mats 30 of FIG. 1, such that the sensing circuits 100 and 100_1, the edge drivers 200, 200_1, and 200_2, and the matching lines ML may be arranged in the outermost edge region of the semiconductor device shown in FIG. 2.

As described above, when the dummy mats 30 and 40 are removed and the sensing circuits 100 and 100_1 coupled to the matching lines ML are controlled by the edge drivers 200, 200_1, and 200_2, the chip size of the semiconductor device shown in FIG. 2 may be greatly reduced as compared to the semiconductor device shown in FIG. 1.

Although FIG. 2 shows the plurality of sensing circuits 100 and 100_1, the plurality of edge drivers 200, 200_1, and 200_2, and the matching lines ML arranged in the outermost upper edge region of the semiconductor device for convenience of description, the scope of the present disclosure is not limited thereto. The plurality of sensing circuits 100 and 100_1, the plurality of edge drivers 200, 200_1, and 200_2, and the matching lines ML may also be arranged in the outermost lower edge region of the semiconductor device or in other outermost edge regions of the semiconductor device in accordance with the spirit of the present disclosure.

Figure 3:
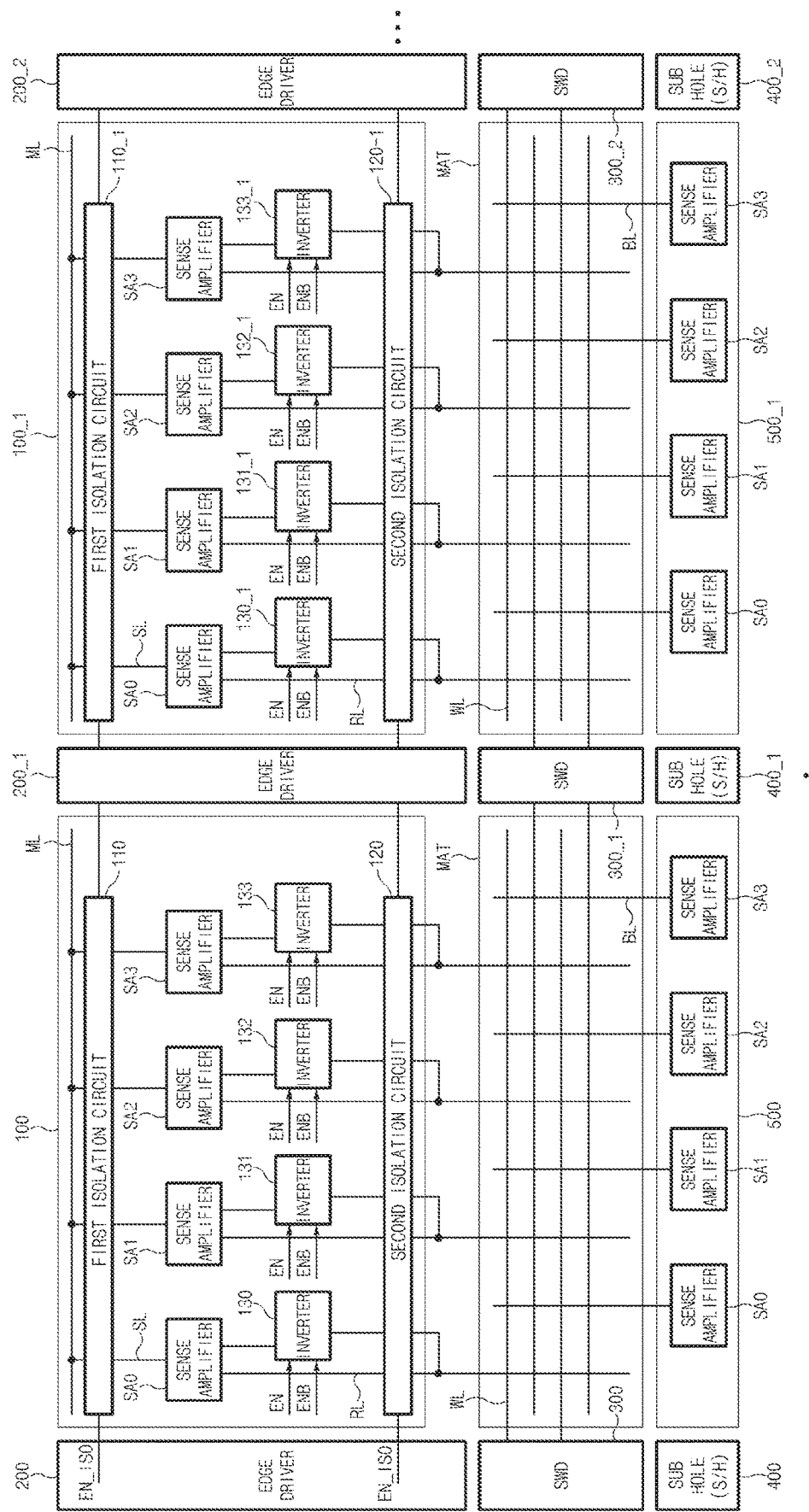
FIG. 3 shows a detailed circuit diagram illustrating the semiconductor device shown in FIG. 2.

FIG. 3 shows a detailed circuit diagram illustrating a portion of the semiconductor device shown in FIG. 2. In particular, FIG. 3 shows a region (A) indicated in FIG. 2 by a broken line.

Referring to FIG. 3, the semiconductor device may include a plurality of mats (MAT), a plurality of sensing circuits 100 and 100_1, a plurality of edge drivers 200~200_2, a plurality of sub word-line drivers (SWD) 300~300_2, and a plurality of sub holes (S/H) 400~400_2. As used herein, the tilde symbol "~" indicates a range.

In this case, the sensing circuits 100 and 100_1 may be identical or similar in structure to each other, such that the embodiment of the present disclosure will hereinafter be described with reference to the sensing circuit 100 for convenience of description. The edge drivers 200~200_2 may be identical or similar in structure to each other, such that the embodiment of the present disclosure will hereinafter be described with reference to the edge driver 200 for convenience of description. The sub word-line drivers (SWD) 300~300_2 may be identical or similar in structure to each other, such that the embodiment of the present disclosure will hereinafter be described with reference to the sub word-line driver (SWD) 300 for convenience of description. The sub holes (S/H) 400~400_2 may be identical or similar in structure to each other, such that the embodiment of the present disclosure will hereinafter be described with reference to the sub hole (S/H) 400 for convenience of description.

The sensing circuit 100 may be arranged in the outermost upper edge region of the semiconductor device, and may sense and amplify data of the mat (MAT). The sensing circuit 100 may include a matching line ML, a first isolation circuit 110, a second isolation circuit 120, a plurality of sense amplifiers SA0~SA3, and a plurality of inverters 130~133. For some embodiments, the first and second isolation circuits may be collocated or the described functionality of the first and second isolation circuits may be performed by a single combined isolation circuit.

The open bit line structured semiconductor device may include a reference bit line having the same loading as in at least one sensing line SL accessed for stable operation. That is, at least one reference line RL coupled to the sense amplifiers SA0~SA3 may be a reference bit line to which substantial data is not applied. In order to match loading of the sensing line SL with loading of the reference line RL, the sensing line SL may be coupled to the matching line ML. In this case, a voltage level of the matching line ML may be set to "VDD/2" (where, VDD is a power-supply voltage level).

Although the embodiment of the present disclosure has exemplarily disclosed that a single matching line ML is coupled to a single sensing circuit 100 for convenience of description, the number of matching lines ML for use in the embodiment may be a plural number, and the number of matching lines ML is not limited thereto.

The first isolation circuit 110 may selectively control connection between the matching line ML and the plurality of sense amplifiers SA0~SA3 in response to an isolation signal EN_ISO. The second isolation circuit 120 may selectively control connection between the mat (MAT) and the plurality of sense amplifiers SA0~SA3 in response to the isolation signal EN_ISO.

The plurality of sense amplifiers SA0~SA3 may sense and amplify data received from the mat (MAT), such that a slight signal difference in the pair of bit lines BL and BLB may be amplified. The plurality of sense amplifiers SA0~SA3 may be coupled between the sensing line SL and the reference line RL. The sensing lines SL of the sense amplifiers SA0~SA3 may be coupled to the matching line ML through the first isolation circuit 110. The reference lines RL of the sense amplifiers SA0~SA3 may be coupled to the bit lines BL of the mat (MAT).

The terms "bit line BL" and "bit line bar BLB" for use in the embodiment are disclosed only for illustrative purposes. The terms "bit line BL" and "bit line bar BLB" may be interchanged without departing from the scope or spirit of the present disclosure.

The inverters 130~133 may respectively invert data sensed by the sense amplifiers SA0~SA3 in response to enable signals EN and ENB, and may output the inverted data to the mat (MAT). In this case, the enable signal EN may be an inversion signal of the enable signal ENB.

For example, the inverters 138~133 may invert data of the sensing lines SL during activation of the enable signal EN and may output the inverted data to the mat (MAT). On the other hand, the inverters 130~133 might not output data of the sensing line SL during deactivation of the enable signal EN (i.e., during activation of the other enable signal ENB).

The edge driver 200 may include a circuit for generating control signals needed for the sensing operation of the sensing circuit 100. For example, the edge driver 200 may generate signals for operating the sense amplifiers SA0~SA3, the enable signals EN and ENB, and the isolation signal EN_ISO. In this case, the edge driver 200 may be arranged in the outermost upper edge region of the semiconductor device.

Among the plurality of sub holes 400 for controlling the sense amplifiers SA0~SA3, one sub hole arranged in the edge region will hereinafter be referred to as "Edge Driver 200". The edge driver 200 may generate not only the isolation signal EN_ISO for driving the first and second isolation circuits 110 and 120 of the sensing circuit 100, but also the enable signals EN and ENB for driving the inverters 130~133.

The sub word-line driver (SWD) 300 may be located close to each mat MAT and may drive the word line WL of each mat (MAT) in response to a row address. The plurality of sub holes 400 may be arranged in an intersection region of a normal sensing circuit 500 and the sub word-line driver (SWD) 300. The sub holes 400 may respectively include circuits for generating drive signals needed to operate the sense amplifiers SA0~SA3.

In response to the word line WL and the bit line BL, the mat (MAT) may store data in a cell array or may output data stored in a cell array. The mat (MAT) may be located close to the sensing circuit 100. Some bit lines of the mat (MAT) may be coupled to the upper sensing circuit 100, and the remaining bit lines may be coupled to lower normal sensing circuits 500 and 500_1.

Figure 4:
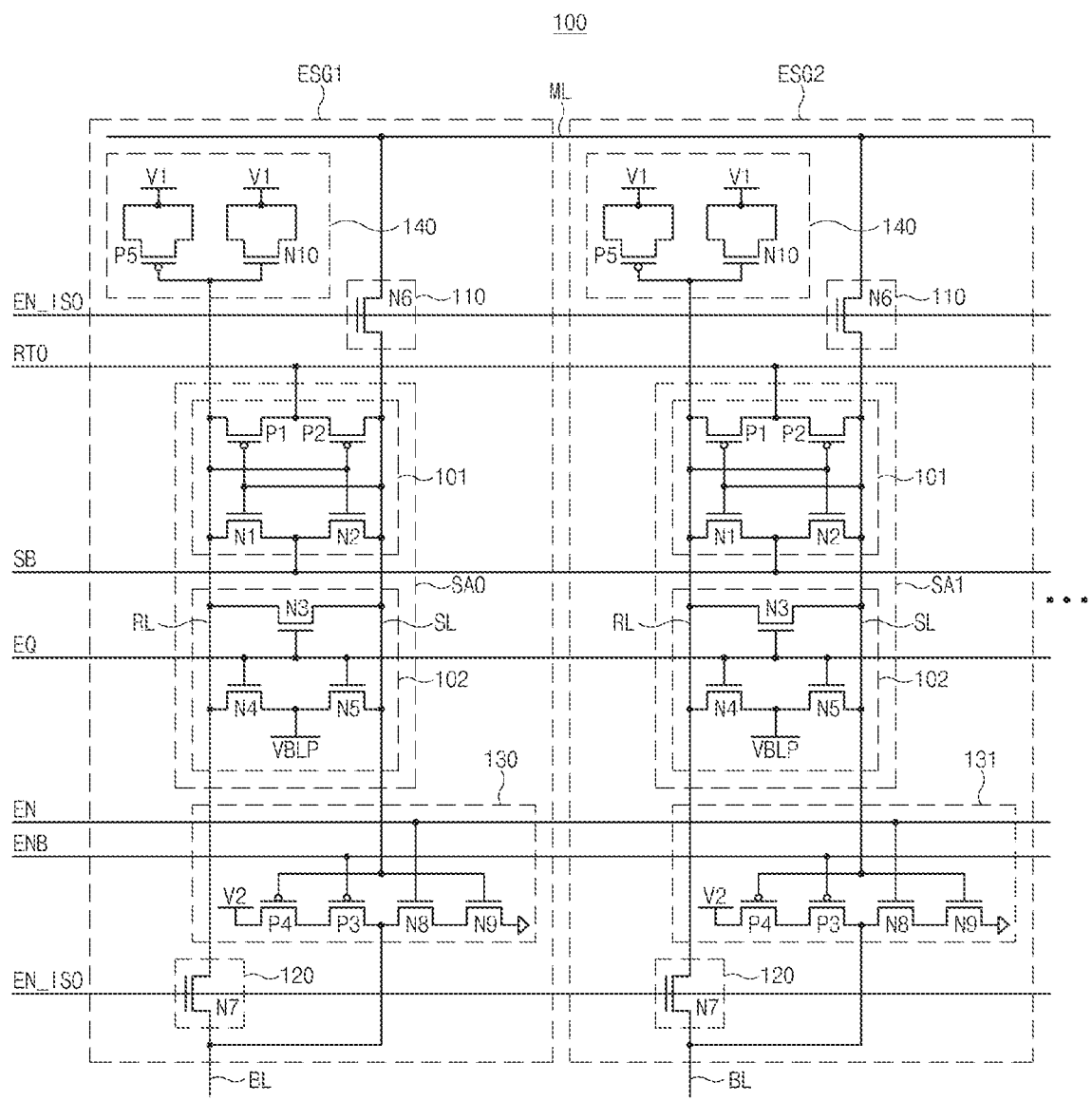
FIG. 4 shows a detailed circuit diagram illustrating the sensing circuit shown in FIG. 3, according to an embodiment of the present disclosure.

FIG. 4 shows a circuit diagram illustrating the sensing circuit 100 shown in FIG. 3 in greater detail. Although four sense amplifiers SA0~SA3 are exemplarily shown in FIG. 3 for convenience of description, the embodiment of FIG. 4 will hereinafter be described with reference to two sense amplifiers S0 and S1 and operations of peripheral circuits thereof.

The sensing circuit 100 may include an edge sensing group ESG1 and an edge sensing group ESG2, as indicated by broken lines. As can be seen from FIG. 4, the edge sensing group ESG1 and the edge sensing group ESG2 may be classified according to the sense amplifiers SA0 and SA1, respectively. As pictured, the edge sensing group ESG1 and the edge sensing group ESG2 share only one matching line ML. The edge sensing group ESG1 and the edge sensing group ESG2 are identical or similar in structure to each other, such that the embodiment of FIG. 4 will hereinafter be described with reference to the edge sensing group ESG1 for convenience of description.

The edge sensing group ESG1 may include a first isolation circuit 110, a matching line ML, a second isolation circuit 120, an inverter 130, a loading circuit 140, and a sense amplifier SA0.

In this case, the first isolation circuit 110 may include an NMOS transistor N6 (pull-down drive element) that is coupled between the matching line ML and the sensing line SL and receives the isolation signal EN_ISO through its gate terminal. The NMOS transistor N6 may be turned on during activation of the isolation signal EN_ISO, such that the matching line ML may be coupled to the sensing line SL. On the other hand, the NMOS transistor N6 may be turned off during deactivation of the isolation signal EN_ISO, such that the connection between the matching line ML and the sensing line SL is cut off.

The second isolation circuit 120 may include an NMOS transistor N7 (pull-down drive element) that is coupled between the bit line BL of the mat (MAT) and the reference line RL and receives the isolation signal EN_ISO through its gate terminal. The NMOS transistor N7 may be turned on during activation of the isolation signal EN_ISO, such that the reference line RL may be coupled to the bit line BL. On the other hand, the NMOS transistor N7 may be turned off during deactivation of the isolation signal EN_ISO, such that the connection between the reference line RL and the bit line BL is cut off.

The inverter 130 may invert data of the sensing line SL, in response to the enable signal EN, and may output the inverted data to the bit line BL. The inverter 130 may include a plurality of NMOS transistors N8 and N9 and a plurality of PMOS transistors P3 and P4.

The plurality of NMOS transistors N8 and N9 and the plurality of PMOS transistors P3 and P4 may be coupled in series between a power-supply voltage (V2) input terminal and a ground voltage terminal. The NMOS transistor N8 may receive the enable signal EN through its gate terminal. The power-supply voltage V2 may have a positive (+) voltage level. For example, the power-supply voltage V2 may be set to a power-supply voltage (VDD) level.

The PMOS transistor P3 may receive the enable signal ENB through its gate terminal. The NMOS transistor N8 and the PMOS transistor P3 may be commonly coupled to the bit line BL through drain terminals thereof. The NMOS transistor N9 and the PMOS transistor P4 may be commonly coupled to the sensing line SL through gate terminals thereof.

The loading circuit 140 may control loading of the reference line RL. The loading circuit 140 may include a PMOS transistor P5 and an NMOS transistor N10. The PMOS transistor P5 and the NMOS transistor N10 may be commonly coupled to the reference line RL through their terminals. A drain terminal and a source terminal of the NMOS transistor N10 may be commonly coupled to a voltage (V1) input terminal. A drain terminal and a source terminal of the PMOS transistor P5 may be commonly coupled to the voltage (V1) input terminal. For an embodiment, the voltage V1 may be set to half of the power supply voltage (VDD/2) level.

The sense amplifier SA0 may sense and amplify data of the bit line BL, and may output the sensed data to the bit line BL in response to the enable signal EN, such that the output data may be stored again in the bit line BL. The sense amplifier SA0 may include a latch circuit 101 and a precharge circuit 102.

The latch circuit 101 may latch data received through the sensing line SL and the reference line RL while in the sensing mode. The latch circuit 101 may include a plurality of PMOS transistors P1 and P2 and a plurality of NMOS transistors N1 and N2. Gate terminals of the PMOS transistors P1 and P2 and the NMOS transistors N1 and N2 may be cross-coupled to each other as shown. The plurality of PMOS transistors P1 and P2 may be coupled in series between the sensing line SL and the reference line RL. The plurality of PMOS transistors P1 and P2 may receive a pull-up drive signal RTO through a common connection node thereof. The plurality of NMOS transistors N1 and N2 may be coupled in series between the sensing line SL and the reference line RL. The plurality of NMOS transistors N1 and N2 may receive a pull-down drive signal SB through a common connection node of the of NMOS transistors N1 and N2.

In a precharge mode, the precharge circuit 102 may precharge the sensing line SL and the reference line RL with a bit line precharge voltage (VBLP) level in response to an equalizing signal EQ. The precharge circuit 102 may include a plurality of NMOS transistors N3~N5 commonly coupled to each other through their gate terminals. The NMOS transistor N3 may be coupled between the sensing line SL and the reference line RL. The NMOS transistors N4 and N5 may be coupled in series between the sensing line SL and the reference line RL. The NMOS transistors N4 and N5 may receive a bit line precharge voltage VBLP through a common connection node of the NMOS transistors N4 and N5.

Figure 5:
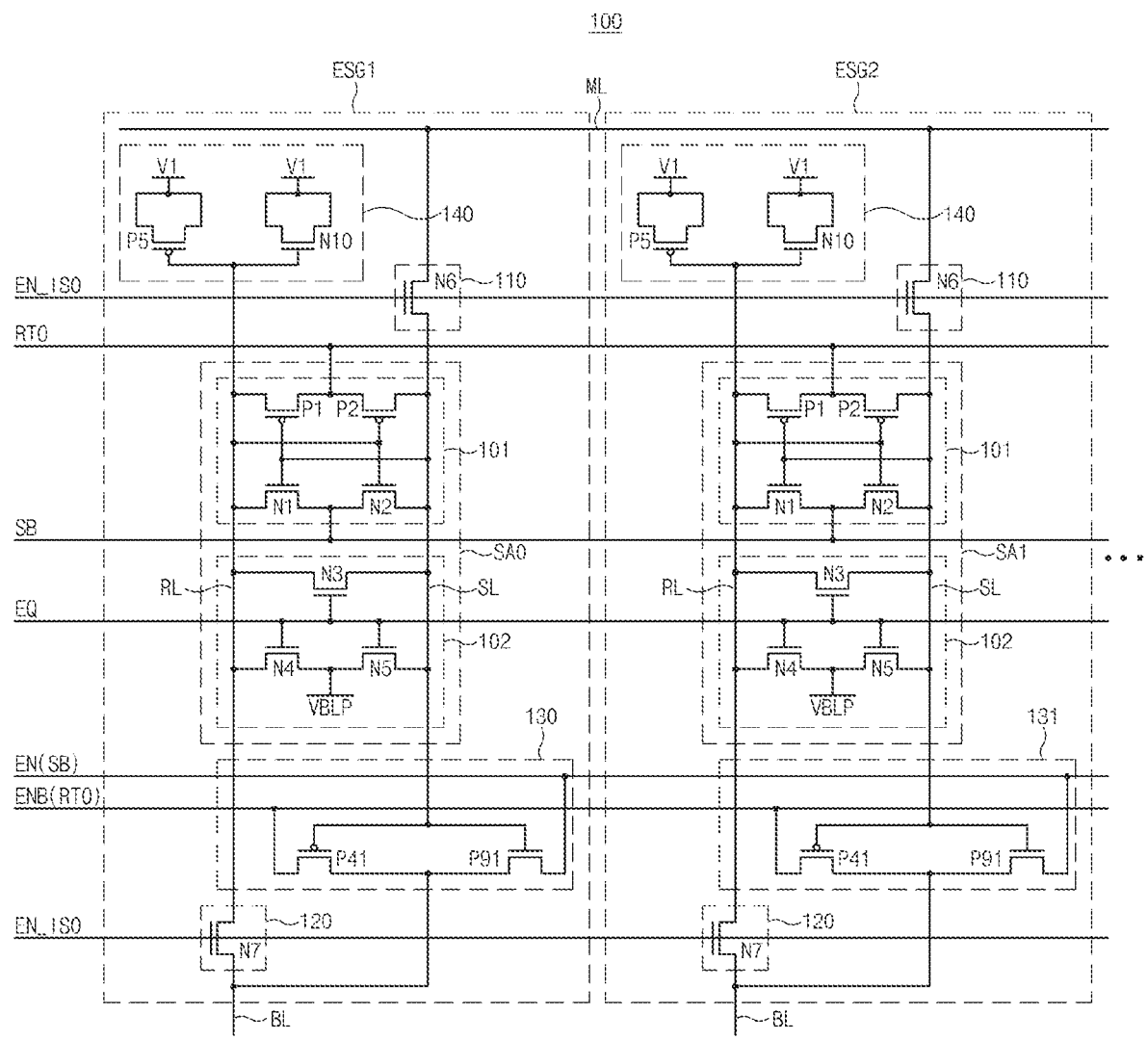
FIG. 5 shows a detailed circuit diagram illustrating the sensing circuit shown in FIG. 3, according to another embodiment of the present disclosure.

FIG. 5 shows a detailed circuit diagram illustrating the sensing circuit 100 shown in FIG. 3 according to another embodiment of the present disclosure.

Compared to the embodiment of FIG. 4, an inverter 130 of the sensing circuit 100 shown in FIG. 5 is different in structure from the inverter 130 of the sensing circuit 100 shown in FIG. 4. The remaining constituent elements other than the inverter 130 in the embodiment of FIG. 5 are identical or similar in structure to those of FIG. 4, therefore, a detailed description of the remaining constituent elements is not repeated here.

The inverter 130 of FIG. 5 may include a PMOS transistor P41 and an NMOS transistor N91. In this case, the PMOS transistor P41 may be coupled between a bit line BL and a pull-up drive signal (RTO) input terminal. The NMOS transistor N91 may be coupled between the pull-down drive signal (SB) input terminal and the bit line BL. The PMOS transistor P41 and the NMOS transistor N91 may be commonly coupled to the bit line BL through their gate terminals.

Since the matching line ML uses the same material as the bit line BL, the sensing circuit 100 of FIG. 5 may use a power-supply line of the inverter 130 as the same power-supply line as in a sense amplifier SA0. That is, an enable signal EN applied to the inverter 130 may be set to a pull-down drive signal SB. The enable signal ENB applied to the inverter 130 may be set to a pull-up drive signal RTO.

Therefore, when the sensing line SL transitions to a logic high level, the NMOS transistor N91 of the inverter 130 is turned on such that the pull-down drive signal SB is applied to the bit line BL. In this case, the pull-down drive signal SB may be set to a ground voltage level. In contrast, when the sensing line SL transitions to a logic low level, the PMOS transistor P41 of the inverter 130 is turned on such that the pull-up drive signal RTO is applied to the bit line BL. In this case, the pull-up drive signal RTO may be set to a power-supply voltage level.

Figure 6:
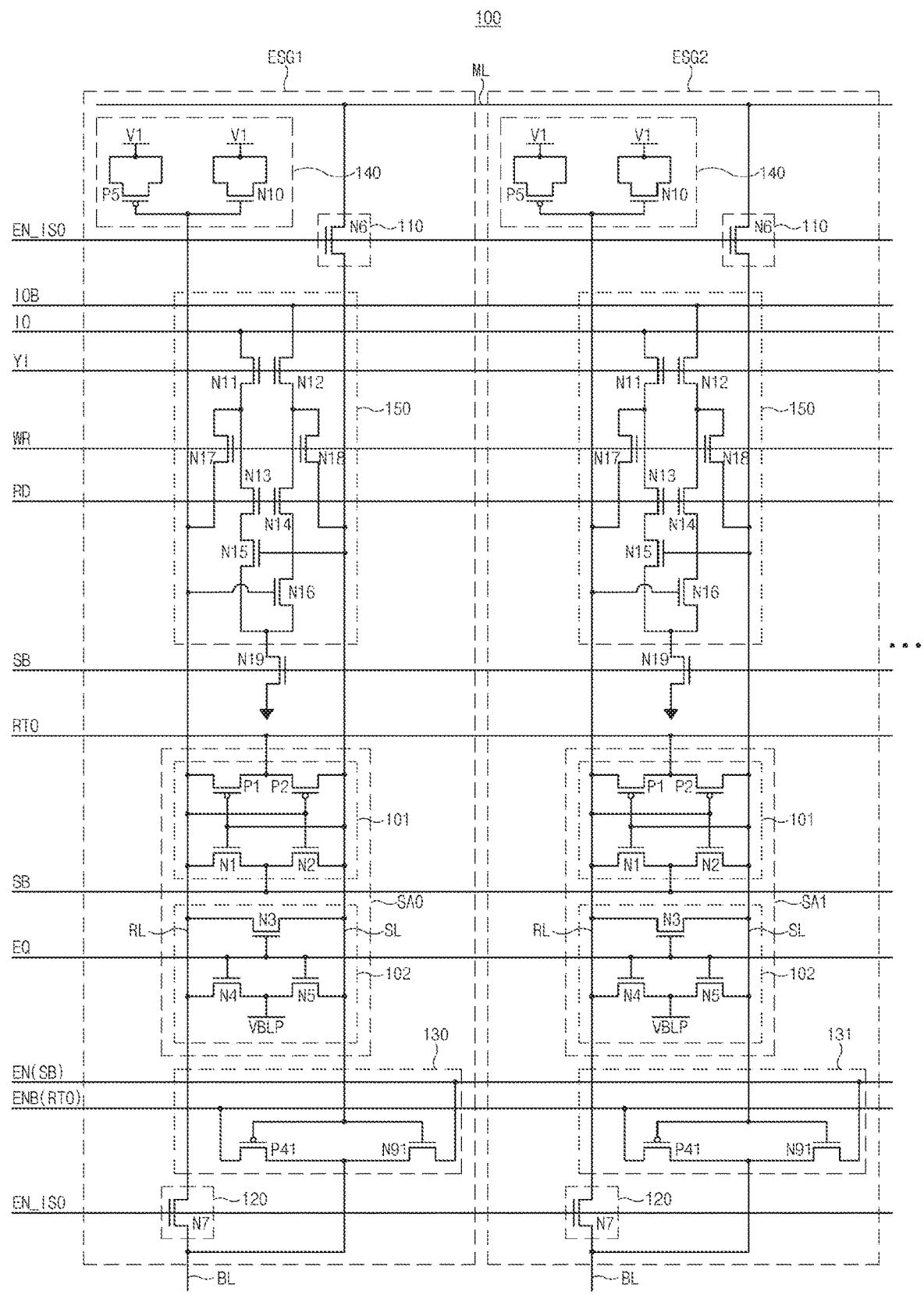
FIG. 6 is a detailed circuit diagram illustrating the sensing circuit shown in FIG. 3, according to another embodiment of the present disclosure.

FIG. 6 shows a detailed circuit diagram illustrating the sensing circuit 100 shown in FIG. 3 according to still another embodiment of the present disclosure.

Compared to the embodiment of FIG. 5, the sensing circuit 100 shown in FIG. 6 may further include a data input and output (also, input/output or I/O) circuit 150. The remaining constituent elements other than the data I/O circuit 150 in the embodiment of FIG. 6 are identical or similar in structure to those of FIG. 5, and as such, a detailed description of the remaining constituent elements is not repeated here.

During a read operation, the data I/O circuit 150 may transmit read data received from the sense amplifier SA0 to input/output (I/O) lines IO and IOB. During a write operation, the data I/O circuit 150 may transmit write data received from input/output (I/O) lines 10 and IOB to the sense amplifier SA0. The data I/O circuit 150 may include a plurality of NMOS transistors N11~N19.

In this case, the NMOS transistor N11 may be coupled between the I/O line IO and the NMOS transistor N13. The NMOS transistor N12 may be coupled between the I/O line IOB and the NMOS transistor N14. The NMOS transistor N11 and the NMOS transistor N12 may receive a column selection signal YI through their commonly-coupled gate terminals.

The NMOS transistor N13 may be coupled between the NMOS transistor N11 and the NMOS transistor N15. The NMOS transistor N14 may be coupled between the NMOS transistor N12 and the NMOS transistor N16. The NMOS transistor N13 and the NMOS transistor N14 may receive a read signal RD through their commonly-coupled gate terminals.

The NMOS transistor N15 may be coupled between the NMOS transistor N13 and the NMOS transistor N19, and may be coupled to the sensing line SL through its gate terminal. The NMOS transistor N16 may be coupled between the NMOS transistor N14 and the NMOS transistor N19, and may be coupled to the reference line RL through its gate terminal.

The NMOS transistor N17 may be coupled between the NMOS transistor N11 and the reference line RL. The NMOS transistor N18 may be coupled between the NMOS transistor N12 and the sensing line SL. The NMOS transistor N17 and the NMOS transistor N18 may receive a write signal WR through their commonly-coupled gate terminals. The NMOS transistor N19 may be coupled between the ground voltage terminal and the NMOS transistors N15 and N16, and may receive the pull-down drive signal SB through its gate terminal.

Operations of the data input/output (I/O) circuit 150 are hereinafter described.

It is assumed that the column selection signal YI is activated to turn on the NMOS transistors N11 and N12 during a read or write operation. If the read signal RD is activated in the read operation, the NMOS transistors N13 and N14 may be turned on. Accordingly, a differential voltage sensed by the sensing line SL, and the reference line RL may be transmitted to the I/O lines IO and IOB through the NMOS transistor N15 or the NMOS transistor N16. In contrast, if the write signal WR is activated in the write operation, then the NMOS transistors N17 and N18 may be turned on. As a result, data received from the I/O lines IO and IOB may be applied to the sensing line SL and the reference line RL.

Figure 7:
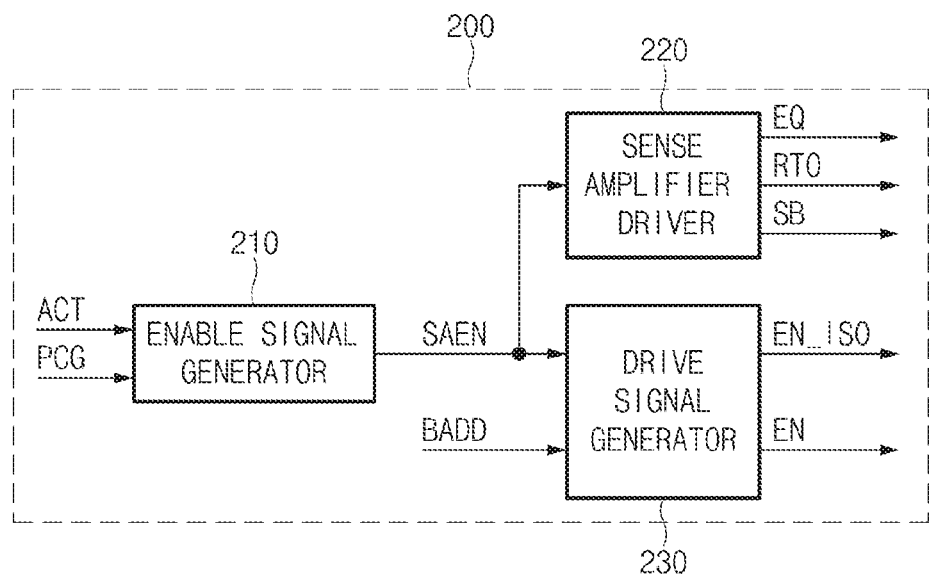
FIG. 7 shows a detailed circuit diagram illustrating the edge driver shown in FIG. 3, according to an embodiment of the present disclosure.

FIG. 7 shows a detailed circuit diagram illustrating the edge driver 200 shown in FIG. 3 according to an embodiment of the present disclosure.

Referring to FIG. 7, the edge driver 200 may include an enable signal generator 210, a sense amplifier driver 220, and a drive signal generator 230.

The enable signal generator 210 may generate a sense amplifier (sense-amp) enable signal SAEN in response to an active signal ACT and a precharge signal PCG. In response to the sense amplifier enable signal SAEN, the sense amplifier driver 220 may output an equalizing signal EQ for precharging the sense amplifier SA0, a pull-up drive signal RTO for driving the sense amplifier SA0, and the pull-down drive signal SB.

The drive signal generator 230 may generate an isolation signal EN_ISO and an enable signal EN in response to the sense amplifier enable signal SAEN and a block address BADD. In response to the block address BADD, edge sensing groups ESG1 and ESG2 of the corresponding block may be selected. If the sense amplifier enable signal SAEN is activated, the enable signal EN is activated. If the isolation signal EN_ISO is deactivated, the sensing data of the sense amplifier SA0 may be stored again.

Figure 8:
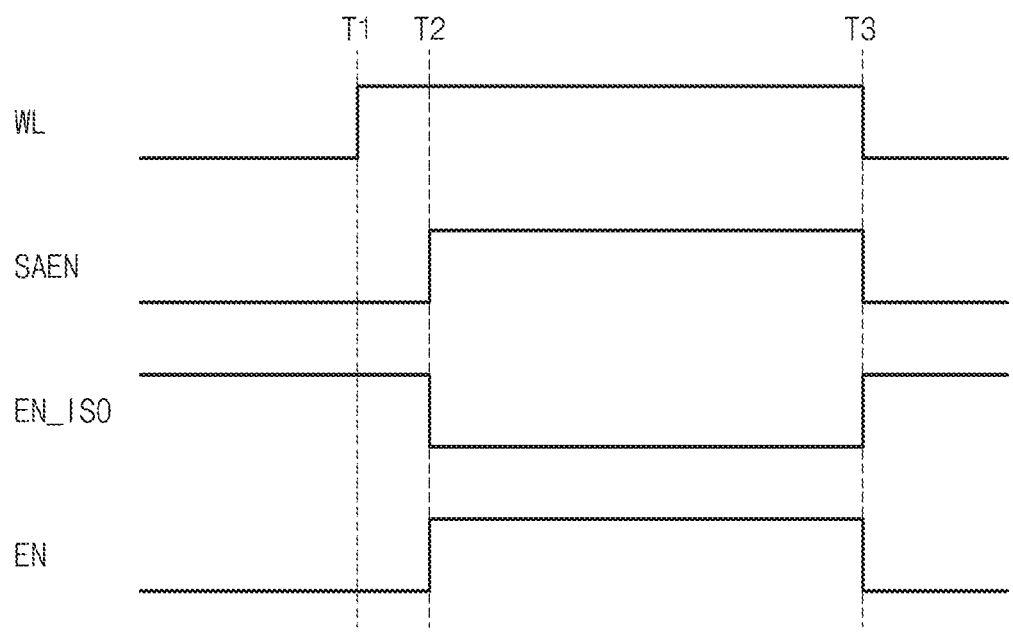
FIG. 8 shows a timing diagram illustrating operations of the edge sensing group shown in FIG. 4.

FIG. 8 shows a timing diagram illustrating operations of the edge sensing group ESG1 shown in FIG. 4. Operations of the edge sensing group ESG1 are hereinafter described with reference to the timing diagram of FIG. 8.

Prior to activation of the word line WL (before reaching a time T1), the sense amplifier enable signal SAEN and the enable signal EN may be deactivated, and the isolation signal EN_ISO may be activated. As a result, the NMOS transistor N6 of the first isolation circuit 110 and the NMOS transistor N7 of the second isolation circuit 120 may be turned on. Therefore, a voltage of the matching line ML may be applied to the sense amplifier SA0 and a voltage V1 of the loading circuit 140 may be applied to the reference line RL, such that the sensing line SL of the sense amplifier SA0 and the reference line RL may be precharged with a VDD/2 voltage level. Here, the enable signal EN is deactivated, such that the inverter 130 does not operate.

Thereafter, the word line WL may be activated at time T1, such that the read operation of the cell array included in the mat (MAT) may be carried out. Thereafter, read data of the mat (MAT) may be transmitted to the sense amplifier SA0 through the bit line BL.

Subsequently, at a time T2, the sense amplifier enable signal SAEN is activated, such that the sensing and amplification operations of the sense amplifier SA0 are performed. If the isolation signal EN_ISO is deactivated, as shown, then the NMOS transistor N6 of the first isolation circuit 110 and the NMOS transistor N7 of the second isolation circuit 120 may be turned off. As a result, the connection between the sense amplifier SA0 and the matching line ML is cut off, such that the connection between the reference line RL and the bit line BL is also cut off.

If the sensing operation of the sense amplifier SA0 is performed, then high-level data or low-level data may be output to the sensing line SL of the sense amplifier SA0. If the enable signal EN is activated, then the inverter 130 operates such that data applied to the sensing line SL is stored again in the bit line BL.

That is, when the enable signal EN is activated and the enable signal ENB is deactivated, the PMOS transistor P3 and the NMOS transistor N8 may be turned on. For example, when data applied to the sensing line SL is at a high level, the NMOS transistor N9 is turned on, such that low-level data may be transmitted to the bit line BL. In contrast, when data applied to the sensing line SL is at a low level, the PMOS transistor P4 is turned on such that high-level data may be applied to the bit line BL. As described above, the inverter 130 may invert a logic level of data received from the sensing line SL, and may output the inverted data to the bit line BL.

Subsequently, at a time T3 when the word line WL and the sense amplifier enable signal SAEN are deactivated, the sensing operation of the sense amplifier SA0 may be completed. Thereafter, when the isolation signal EN_ISO is again activated, the sense amplifier SA0 may be coupled to the matching line ML and the reference line RL may be coupled to the bit line BL. In addition, since the enable signal EN is deactivated again, the inverter 130 stops operation.

As described above, embodiments of the present disclosure may remove a dummy mat that includes a plurality of dummy cells and at least one dummy bit line and may control operations of the sense amplifier SA0 through a matching line ML, resulting in a reduction in the chip size of a semiconductor device.

As is apparent from the above description, the sensing circuit and the semiconductor device including the sensing circuit according to embodiments of the present disclosure may reduce chip size by removing a dummy mat located at an edge region of the chip.

Those skilled in the art will appreciate that disclosed embodiments may be carried out in other specific ways from those set forth herein without departing from the spirit and characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A sensing circuit comprising:
   a sense amplifier configured to sense and amplify data applied to each of a sensing line and a reference line;
   a first isolation circuit configured to selectively control a connection between a matching line and the sensing line in response to an isolation signal;
   a second isolation circuit configured to selectively control a connection between the reference line and a bit line in response to the isolation signal; and
   an inverter coupled between the sensing line and the bit line,
   wherein the matching line is coupled to the sensing line to match a loading of the sensing line and the reference line with each other.

2. The sensing circuit according to claim 1, wherein the first isolation circuit is further configured to cut off the connection between the matching line and the sensing line based on deactivation of the isolation signal within an activation period of the sense amplifier.

3. The sensing circuit according to claim 1, wherein the first isolation circuit comprises:
   a pull-down drive element connected between the matching line and the sensing line, wherein the pull-down drive element is configured to receive the isolation signal through a gate terminal of the pull-down drive element.

4. The sensing circuit according to claim 1, wherein the second isolation circuit is further configured to cut off the connection between the reference line and the bit line based on deactivation of the isolation signal within an activation period of the sense amplifier.

5. The sensing circuit according to claim 1, wherein the second isolation circuit comprises:
   a pull-down drive element connected between the reference line and the bit line, wherein the pull-down drive element is configured to receive the isolation signal through a gate terminal of the pull-down drive element.

6. The sensing circuit according to claim 1,
   wherein the inverter is configured to invert data of the sensing line in response to an enable signal, and is configured to output the inverted data to the bit line, and
   wherein the inverter comprises:
   a first p-type metal-oxide-semiconductor (PMOS) transistor configured to selectively output a power-supply voltage in response to an output signal of the sensing line;
   a first n-type metal-oxide-semiconductor (NMOS) transistor configured to selectively output a ground voltage in response to the output signal of the sensing line;
   a second NMOS transistor configured to output a first voltage received from the first NMOS transistor to the bit line in response to the enable signal; and
   a second PMOS transistor configured to output a second voltage received from the first PMOS transistor to the bit line in response to an inversion signal of the enable signal.

7. The sensing circuit according to claim 1,
   wherein the inverter is configured to invert data of the sensing line in response to an enable signal, and is configured to output the inverted data to the bit line, and
   wherein the inverter comprises:
   a p-type metal-oxide-semiconductor (PMOS) transistor configured to output a pull-up drive signal to the bit line in response to an output signal of the sensing line; and
   a n-type metal-oxide-semiconductor (NMOS) transistor configured to output a pull-down drive signal to the bit line in response to an output signal of the sensing line.

8. The sensing circuit according to claim 1,
wherein the inverter is configured to invert data of the sensing line in response to an enable signal, and is configured to output the inverted data to the bit line, and
wherein the inverter is configured to invert data of the sensing line based on activation of the enable signal within an activation period of the sense amplifier.

9. The sensing circuit according to claim 1 further comprising:
a loading circuit configured to control loading of the reference line.

10. The sensing circuit according to claim 9, wherein the loading circuit comprises:
a p-type metal-oxide-semiconductor (PMOS) transistor with a drain terminal and a source terminal commonly coupled to an input terminal for a first voltage and a gate terminal coupled to the reference line; and
a n-type metal-oxide-semiconductor (NMOS) transistor with a drain terminal and a source terminal commonly coupled to the input terminal for the first voltage and a gate terminal coupled to the reference line.

11. The sensing circuit according to claim 1, wherein the first voltage is set to half a power-supply voltage.

12. The sensing circuit according to claim 1, wherein the matching line is set to a voltage level of half a power-supply voltage.

13. The sensing circuit according to claim 1 further comprising:
a data input and output (I/O) circuit configured to transmit a voltage sensed by the sense amplifier to an I/O line during a read operation, and configured to transmit write data received from the I/O line to the sense amplifier during a write operation.

14. A semiconductor device comprising:
a mat configured to store data selected by a word line and a bit line in a cell array; and
a sensing circuit comprising a plurality of sense amplifiers, wherein the sensing circuit is configured to:
sense and amplify data applied to each of a sensing line and a reference line,
cut off a connection between a matching line and the sensing line in response to an isolation signal, during a sensing operation of the plurality of sense amplifiers, and
cut off a connection between the reference line and the bit line, during the sensing operation.

15. The semiconductor device according to claim 14, wherein the sensing circuit is arranged in an outermost edge region of the semiconductor device.

16. The semiconductor device according to claim 14 further comprising:
an edge driver configured to generate a plurality of control signals for controlling driving of the sensing circuit.

17. The semiconductor device according to claim 16, wherein the edge driver comprises:
an enable signal generator configured to generate a sense amplifier enable signal upon receiving an active signal and a precharge signal;
a sense amplifier driver configured to generate an equalizing signal for precharging a sense amplifier and to generate a drive signal for driving the sense amplifier, upon receiving the sense amplifier enable signal; and
a drive signal generator configured to generate the isolation signal and an enable signal upon receiving the sense amplifier enable signal and a block address.

18. The semiconductor device according to claim 14, wherein the sensing circuit further comprises:
a first isolation circuit configured to selectively control a connection between the matching line and the sensing line in response to the isolation signal;
a second isolation circuit configured to selectively control a connection between the reference line and the bit line in response to the isolation signal; and
an inverter configured to invert data of the sensing line in response to an enable signal and to output the inverted data to the bit line.

19. The semiconductor device according to claim 18, wherein:
the first isolation circuit is configured to cut off the connection between the matching line and the sensing line by deactivation of the isolation signal within an activation period of the sense amplifier; and
the second isolation circuit is configured to cut off the connection between the reference line and the bit line by deactivation of the isolation signal within the activation period of the sense amplifier.

20. The semiconductor device according to claim 14, wherein the matching line is set to a voltage level of half a power-supply voltage.

* * * * *